US012682968B2

(12) United States Patent
Kang et al.

(10) Patent No.: US 12,682,968 B2
(45) Date of Patent: Jul. 14, 2026

(54) METHOD OF OPERATING A THREE-DIMENSIONAL SEMICONDUCTOR MEMORY DEVICE

(71) Applicants: SK hynix Inc., Icheon-si (KR); INDUSTRY-UNIVERSITY COOPERATION FOUNDATION HANYANG UNIVERSITY, Seoul (KR)

(72) Inventors: In Ku Kang, Icheon-si (KR); Kyung Hoon Min, Icheon-si (KR); Sung In Hong, Icheon-si (KR); Yun Heub Song, Seoul (KR); Jae Min Sim, Seoul (KR); Ji Ho Song, Seoul (KR)

(73) Assignees: SK hynix Inc., Icheon-si (KR); INDUSTRY-UNIVERSITY COOPERATION FOUNDATION HANYANG UNIVERSITY, Seoul (KR)

( * ) Notice: Subject to any disclaimer, the term of this patent is extended or adjusted under 35 U.S.C. 154(b) by 141 days.

(21) Appl. No.: 18/815,547

(22) Filed: Aug. 26, 2024

(65) Prior Publication Data

US 2025/0078942 A1 Mar. 6, 2025

(30) Foreign Application Priority Data

Aug. 28, 2023 (KR) ........................ 10/2023/0112815

(51) Int. Cl.
*G11C 16/26* (2006.01)
*G11C 16/04* (2006.01)
(Continued)

(52) U.S. Cl.
CPC ...... *G11C 16/3459* (2013.01); *G11C 16/0483* (2013.01); *G11C 16/102* (2013.01); *G11C 16/26* (2013.01)

(58) Field of Classification Search
CPC ............ G11C 16/3459; G11C 16/0483; G11C 16/102; G11C 16/26; G11C 16/32;
(Continued)

(56) References Cited

U.S. PATENT DOCUMENTS

2022/0415419 A1* 12/2022 Shin ........................ G11C 16/10
2024/0274203 A1* 8/2024 Song ...................... G11C 16/10
(Continued)

FOREIGN PATENT DOCUMENTS

KR 10-1946179 B1 2/2019
KR 10-2022-0036208 A 3/2022
KR 10-2022-0154866 A 11/2022

OTHER PUBLICATIONS

Jae-Min Sim et al., "A novel gate-all-around with back-gate (GAAB) 3D NAND flash memory structure for high performance with disturbance-less program operation," Memories—Materials, Devices, Circuits and Systems, 2023, vol. 5, 100073.

*Primary Examiner* — Amir Zarabian

(57) ABSTRACT

A method of programming a three-dimensional semiconductor memory device includes applying a first word line programming voltage to a selected word line among the word lines, floating unselected word lines among the word lines, and applying a back-gate pass voltage to the back-gate electrode; applying a first word line verification voltage to the selected word line, applying a word line pass voltage to the unselected word lines, and applying a first back-gate verification voltage to the back-gate electrode; applying a second word line programming voltage to the selected word line, floating the unselected word lines, and applying the back-gate pass voltage to the back-gate electrode; and applying a second word line verification voltage to the selected word line, applying the word line pass voltage to the (Continued)

unselected word lines, and applying a second back-gate verification voltage to the back-gate electrode.

18 Claims, 18 Drawing Sheets

(51) Int. Cl.
    *G11C 16/10*         (2006.01)
    *G11C 16/34*         (2006.01)

(58) Field of Classification Search
    CPC ......... G11C 16/08; G11C 16/10; G11C 16/24;
                            G11C 16/3427; H10B 43/27
    USPC ...................................................... 365/185.2
    See application file for complete search history.

(56)                References Cited

U.S. PATENT DOCUMENTS

2025/0087272 A1*   3/2025  Song ..................... G11C 16/10
2025/0157551 A1*   5/2025  Li ........................... G11C 16/26

* cited by examiner

METHOD OF OPERATING A THREE-DIMENSIONAL SEMICONDUCTOR MEMORY DEVICE

The present application claims priority under 35 U.S.C. § 119 to Korean Patent Application No. 10-2023-0112815, filed on Aug. 28, 2023, in the Korean Intellectual Property Office, which is incorporated herein by reference in its entirety.

BACKGROUND

1. Field

Embodiments of the present disclosure relates to methods of operating a three-dimensional semiconductor memory device.

2. Description of the Related Art

During programming and reading operations in a three-dimensional semiconductor memory device, significant voltage disparities between a selected word line and a selected bit line, as well as various voltages applied to non-selected word lines and bit lines, contribute to decreased operating speeds and introduce various disturbances.

SUMMARY

According to an embodiment of present disclosure, a method of programming a three-dimensional semiconductor memory device is provided. The three-dimensional semiconductor memory device includes word lines extending in a first direction and stacked in a third direction, the first direction being parallel to a top surface of a substrate, the third direction being perpendicular to the top surface of the substrate; vertical channel structures that pass through the word lines, wherein each of the vertical channel structures includes a back-gate electrode, a channel layer, and a memory layer; a common source line electrically connected to a first end of the channel layer of each of the vertical channel structures; bit lines extending in a second direction, each of the bit lines being electrically connected to a second end of the channel layer of each of the vertical channel structures, the second direction crossing the first direction and parallel to the top surface of the substrate; and a back-gate line electrically connected to a first end of the back-gate electrode of each of the vertical channel structures. The method includes applying a first word line programming voltage to a selected word line among the word lines, floating unselected word lines among the word lines, and applying a back-gate pass voltage to the back-gate electrode in a first programming step; applying a first word line verification voltage to the selected word line, applying a word line pass voltage to the unselected word lines, and applying a first back-gate verification voltage to the back-gate electrode in a first verification step; applying a second word line programming voltage to the selected word line, floating the unselected word lines, and applying the back-gate pass voltage to the back-gate electrode in a second programming step; and applying a second word line verification voltage to the selected word line, applying the word line pass voltage to the unselected word lines, and applying a second back-gate verification voltage to the back-gate electrode in a second verification step. The second word line programming voltage is greater than the first word line programming voltage. The second back-gate verification voltage is lower than the first back-gate verification voltage.

According to an embodiment of present disclosure, a method of reading a three-dimensional semiconductor memory device is provided. The three-dimensional semiconductor memory device includes word lines extending in a first direction and stacked in a third direction, the first direction being parallel to a top surface of a substrate, the third direction being perpendicular to the top surface of the substrate; vertical channel structures that pass through the word lines, wherein each of the vertical channel structures includes a back-gate electrode, a channel layer, and a memory layer; a common source line electrically connected to a first end of the channel layer of each of the vertical channel structures; bit lines extending in a second direction, each of the bit lines being electrically connected to a second end of the channel layer of each of the vertical channel structures, the second direction crossing the first direction and parallel to the top surface of the substrate; and a back-gate line electrically connected to a first end of the back-gate electrode of each of the vertical structures. The method includes applying a word line read voltage to a selected word line among the word lines; applying a word line pass voltage to unselected word lines among the word lines; and applying a back-gate read voltage to the back-gate electrode of each of the vertical channel structures. The word line read voltage includes a plurality of pulses that change from an initial word line read voltage of a negative voltage to a final word line read voltage of a positive voltage. The final word line read voltage is lower than the word line pass voltage.

According to an embodiment of present disclosure, a method of reading a three-dimensional semiconductor memory device is provided. The three-dimensional semiconductor device includes a plurality of word lines extending in a first direction and stacked in a third direction, the first direction being parallel to a top surface of a substrate, the third direction being perpendicular to the top surface of the substrate; vertical channel structures that pass through the plurality of word lines, wherein each of the vertical channel structures includes a back-gate electrode, a channel layer, and a memory layer; a common source line electrically connected to a first end of the channel layer of each of the vertical channel structures; bit lines extending in a second direction, each of the bit lines being electrically connected to a second end of the channel layer of each of the vertical channel structures, the second direction crossing the first direction and parallel to the top surface of the substrate; and a back-gate line electrically connected to a first end of the back-gate electrode of each of the vertical channel structures. The method includes applying a word line read voltage to a selected word line among the plurality of word lines; applying a word line pass voltage to unselected word lines among the plurality of word lines, and applying a back-gate read voltage to the back-gate electrode. The back-gate read voltage includes a plurality of pulses that change from an initial back-gate read voltage of a positive voltage to a final back-gate read voltage of a negative voltage. The initial back-gate read voltage is lower than the word line pass voltage.

DETAILED DESCRIPTION

Figure 1A:
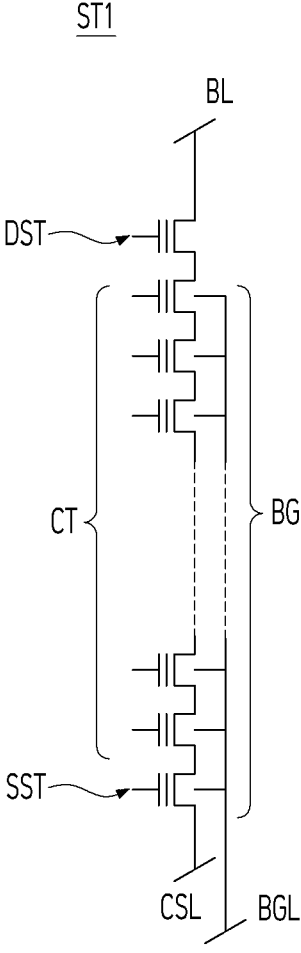
FIGS. 1A and 1B are circuit diagrams schematically illustrating cell strings of a three-dimensional semiconductor memory device according to embodiments of the present disclosure.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It will be understood that, although the terms "first" and/or "second" may be used herein to describe various elements, these elements should not be limited by these terms. These terms are only used to distinguish one element, from another element. For instance, a first element discussed below could be termed a second element without departing from the teachings of the present disclosure. Similarly, the second element could also be termed the first element.

Other expressions that explain the relationship between elements, such as "between," "directly between," "adjacent to," or "directly adjacent to" should be construed in the same way.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

An embodiment of the present disclosure provides improved cell performance of a three-dimensional semiconductor memory device.

An embodiment of the present disclosure provides operating methods of a three-dimensional semiconductor memory device using a reduced programming voltage.

An embodiment of the present disclosure provides operating methods of a three-dimensional semiconductor memory device using a plurality of back-gate verification voltages.

An embodiment of the present disclosure provides operating methods of a three-dimensional semiconductor memory device using a plurality of word line read voltages.

An embodiment of the present disclosure provides operating methods of a three-dimensional semiconductor memory device using a plurality of back-gate read voltages.

Figure 1B:
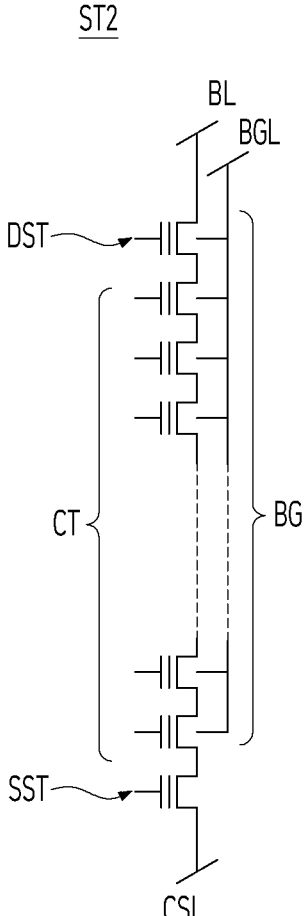

FIGS. 1A and 1B are circuit diagrams schematically illustrating cell strings ST1 and ST2 of a three-dimensional semiconductor memory device according to embodiments of the present disclosure. Referring to FIGS. 1A and 1B, each of the cell strings ST1 and ST2 may include a drain selection transistor DST, a plurality of cell transistors CT, a source selection transistor SST, and a back-gate electrode BG. The drain selection transistor DST, the plurality of cell transistors CT, and the source selection transistor SST may be connected in series between a bit line BL and a common source line CSL.

The drain selection transistor DST may be positioned closest to the bit line BL among the drain selection transistor DST, the plurality of cell transistors CT, and the source selection transistor SST. A drain electrode of the drain selection transistor DST may be electrically connected to the bit line BL.

The source selection transistor SST may be positioned closest to the common source line CSL among the drain selection transistor DST, the plurality of cell transistors CT, and the source selection transistor SST. A source electrode of the source selection transistor SST may be electrically connected to the common source line CSL.

The back-gate electrode BG may be electrically connected to either the drain selection transistor DST or the source selection transistor SST, as well as to bodies of the plurality of cell transistors CT. For example, the back-gate electrode BG may be capacitively connected to a channel of either the drain selection transistor DST or the source selection transistor SST, as well as to channels of the plurality of cell transistors CT. A first end of the back-gate electrode BG may be connected to a back-gate line BGL, and a second end of the back-gate electrode BG may be floated.

Referring to FIG. 1A, the back-gate line BGL may be disposed under the cell string ST1 in a vertical direction that is perpendicular to a top surface of a substrate. For example, the back-gate line BGL may be disposed adjacent to the common source line CSL. Accordingly, a lower end of the back-gate electrode BG may be connected to the back-gate line BGL. The back-gate electrode BG may not overlap with the channel of the drain selection transistor DST positioned at the uppermost portion of the cell string ST1 when viewed in a horizontal direction parallel to the top surface of the substrate. That is, as described above, the back-gate electrode BG may not be connected to the body of the drain selection transistor DST located at the top of the cell string ST1.

Referring to FIG. 1B, the back-gate line BGL may be disposed over the cell string ST2 in the vertical direction. For example, the back-gate line BGL may be disposed adjacent to the bit line BL. Accordingly, an upper end of the back-gate electrode BG may be connected to the back-gate line BGL. The back-gate electrode BG may not overlap with the channel of the source selection transistor SST positioned at the lowermost portion of the cell string ST2 when viewed in the horizontal direction. That is, as described above, the back-gate electrode BG may not be connected to the body of the source selection transistor SST located at the lowermost portion of the cell string ST2.

Figure 2:
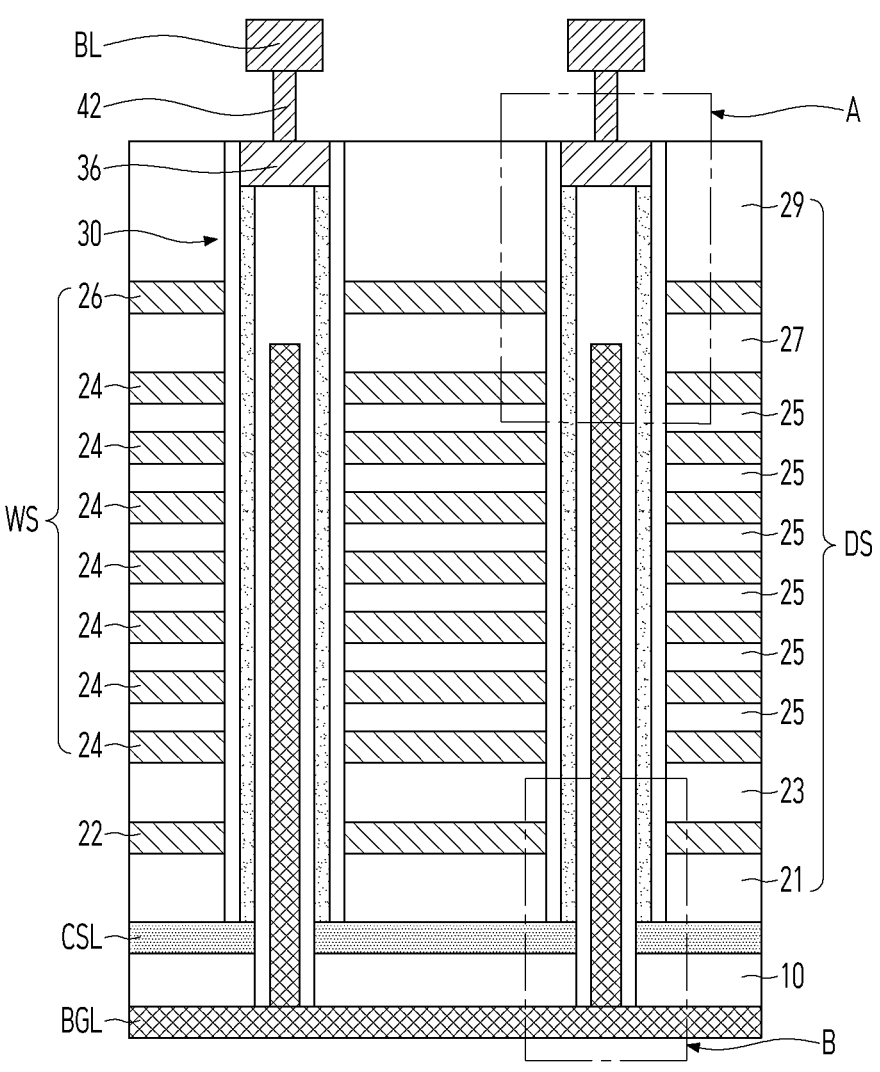
FIG. 2 is a schematic longitudinal cross-sectional view illustrating a cell structure of a three-dimensional semiconductor memory device according to an embodiment of the present disclosure.
Figure 3A:
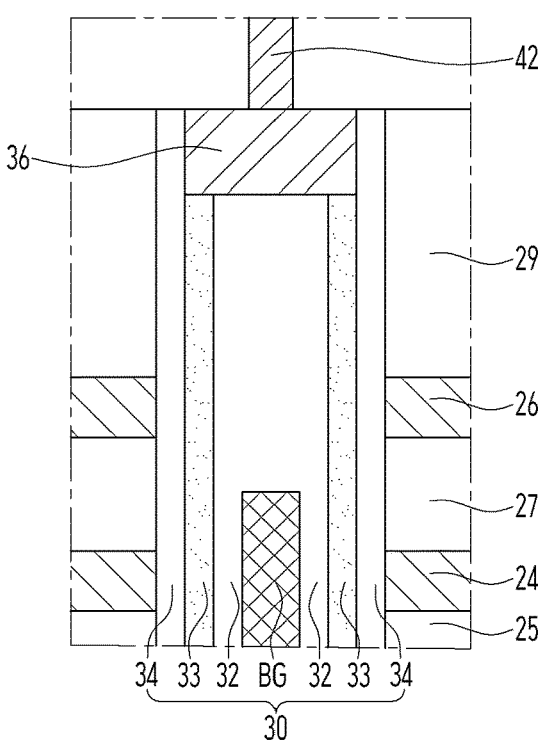
FIG. 3A is an enlarged view of area A of FIG. 2.
Figure 3B:
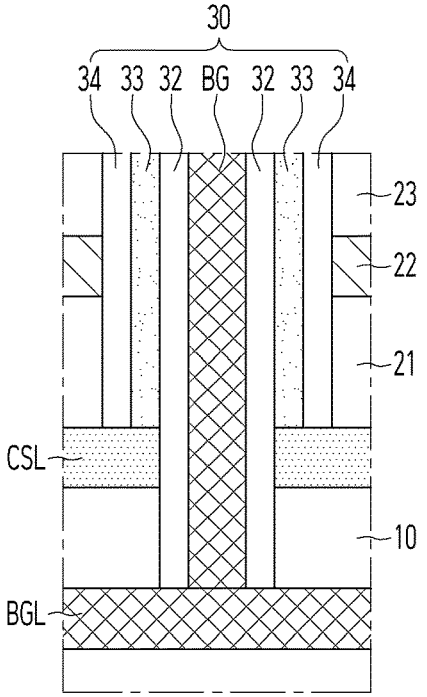
FIG. 3B is an enlarged view of area B of FIG. 2.

FIG. 2 is a schematic longitudinal cross-sectional view illustrating a cell structure of a three-dimensional semiconductor memory device according to an embodiment of the present disclosure, FIG. 3A is an enlarged view of area A of FIG. 2, and FIG. 3B is an enlarged view of area B of FIG. 2. Referring to FIGS. 2, 3A, and 3B, the cell structure of the three-dimensional semiconductor memory device may include a substrate 10, a back-gate line BGL, a common source line CSL, an insulating layer stack DS, a word line stack WS, a vertical channel structure 30, a channel pad 36, a bit line contact plug 42, and a bit line BL.

The substrate 10 may include a silicon wafer. In another embodiment, the substrate 10 may include an epitaxially grown silicon layer or a silicon germanium layer. In still another embodiment, the substrate 10 may include a silicon on insulator (SOI).

The back-gate line BGL may be integrated within or on the substrate 10. The back-gate line BGL may be composed of one or more conductive materials, such as doped silicon, metal silicide, a metal compound, a metal, or a metal alloy. In a plan view, the back-gate line BGL may have a shape of a plurality of parallel lines extending in a horizontal direction that is parallel to a top surface of the substrate 10. In another embodiment, the back-gate line BGL may have a plate-like structure in the plan view.

The common source line CSL may be disposed on the substrate 10. In an embodiment, the common source line CSL may be integrated within or on the substrate 10. The common source line CSL may be composed of one or more conductive materials, such as doped silicon, metal silicide, a metal compound, a metal, or a metal alloy. In a plan view, the common source line CSL may have a shape of a plurality of parallel lines extending in the horizontal direction. In another embodiment, the common source line CSL may have a plate-like structure in the plan view.

The insulating layer stack DS may include a bottom interlayer insulating layer 21, a lower interlayer insulating layer 23, a plurality of cell interlayer insulating layers 25, an upper interlayer insulating layer 27, and a top interlayer insulating layer 29 that are stacked in a vertical direction perpendicular to the top surface of the substrate 10. The bottom interlayer insulating layer 21, the lower interlayer insulating layer 23, the plurality of cell interlayer insulating layers 25, the upper interlayer insulating layer 27, and the top interlayer insulating layer 29 may each include silicon oxide.

The word line stack WS may include a source selection gate 22, a plurality of cell gates 24, and a drain selection gate 26 that are stacked in the vertical direction. Each of the source selection gate 22, the plurality of cell gates 24, and the drain selection gate 26 may be composed of one or more conductive materials, such as doped silicon, metal silicide, a metal compound, a metal, or a metal alloy. The plurality of cell gates 24 may be a plurality of word lines to turn-on memory cells.

The source selection gate 22 may be disposed between the bottom interlayer insulating layer 21 and the lower interlayer insulating layer 23. The plurality of cell gates 24 and the plurality of cell interlayer insulating layers 25 may be alternately stacked between the lower interlayer insulating layer 23 and the upper interlayer insulating layer 27. The drain selection gate 26 may be disposed between the upper interlayer insulating layer 27 and the top interlayer insulating layer 29. The source selection gate 22 may turn-on/turn-off an electrical connection between the common source line CSL and the plurality of cell gates 24. The drain selection gate 26 may turn-on/turn-off an electrical connection between the bit line BL and the plurality of cell gates 24.

The vertical channel structure 30 may vertically pass through the insulating layer stack DS and the word line stack WS to be electrically connected to the common source line CSL and the back-gate line BGL.

Referring to FIGS. 3A and 3B, the vertical channel structure 30 may include a back-gate electrode BG, a central insulating layer 32, a channel layer 33, and a memory layer 34. The back-gate electrode BG may have a pillar shape and be disposed at a central position of the vertical channel structure 30 when viewed in a plan view. The back-gate electrode BG may pass through the common source line CSL so that its lower end is connected to the back-gate line BGL. Therefore, the back-gate electrode BG may receive power from the back-gate line BGL that is disposed below the vertical channel structure 30. An upper end of the back-gate electrode BG may be floated.

The central insulating layer 32 may surround side surfaces of the back-gate electrode BG in a cylinder shape. The central insulating layer 32 may electrically insulate the back-gate electrode BG from the common source line CSL. The central insulating layer 32 may also cover the upper end of the back-gate electrode BG.

The channel layer 33 may surround side surfaces of the central insulating layer 32 in a cylinder shape. The channel layer 33 may include a semiconductor material. For example, the channel layer 33 may include intrinsic silicon or N-doped silicon. The channel layer 33 may be electrically connected to the common source line CSL.

The memory layer 34 may surround side surfaces of the channel layer 33 in a cylinder shape. The memory layer 34 may include a plurality of insulating layers. In an embodiment, the memory layer 34 may include three insulating layers, e.g., an oxide layer, a nitride layer, and an oxide layer. For example, the memory layer 34 may include a silicon oxide based insulation layer, a silicon nitride based insulation layer, and a metal oxide based insulation layer.

A channel pad 36 may be disposed on the vertical channel structure 30. The channel pad 36 may be electrically connected to an upper end of the channel layer 33. The channel pad 36 may have a lid shape covering the vertical channel structure 30. The channel pad 36 may be composed of one or more conductive materials, such as doped silicon, metal silicide, a metal compound, a metal, or a metal alloy.

A bit line contact plug 42 may be disposed on the channel pad 36. The bit line contact plug 42 may be electrically and vertically connected to the channel pad 36. The bit line contact plug 42 may be composed of one or more conductive materials, such as doped silicon, metal silicide, a metal compound, a metal, or a metal alloy.

The bit line BL may be disposed on the bit line contact plug 42. The bit line BL may extend in the horizontal direction. The bit line BL may be composed of one or more conductive materials, such as doped silicon, metal silicide, a metal compound, a metal, or a metal alloy.

Figure 4:
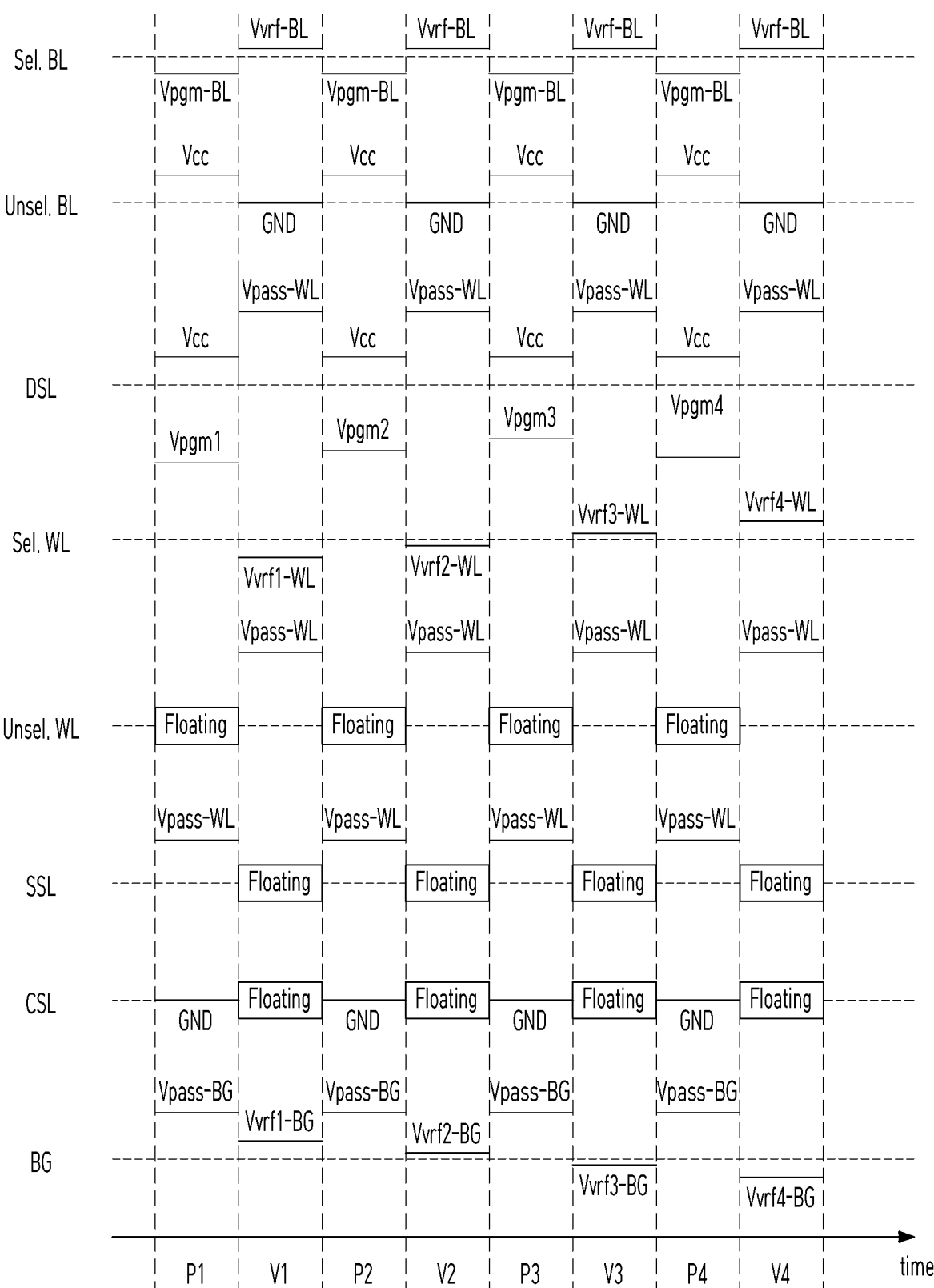
FIG. 4 is a timing diagram illustrating a programming operation of a three-dimensional semiconductor memory device according to an embodiment of the present disclosure.

FIG. 4 is a timing diagram illustrating a programming operation of a three-dimensional semiconductor memory device according to an embodiment of the present disclosure.

Referring to FIG. 4, the programming operation may include a plurality of programming steps P1-P4 and a plurality of verification steps V1-V4 that are alternately performed. For example, the programming operation may include performing a sequence that includes: a first programming step P1, a first verification step V1, a second programming step P2, a second verification step V2, a third programming step P3, a third verification step V3, a fourth programming step P4, and a fourth verification step V4. In another embodiment, the programming operation may include performing a sequence that includes: the first programming step P1, the first verification step V1, the second programming step P2, and the second verification step V2. In still another embodiment, the programming operation may include performing a sequence that includes: the first programming step P1, the first verification step V1, the second programming step P2, the second verification step V2, the third programming step P3, and the third verification step V3. Embodiments are not limited thereto. In still another embodiment, the programming operation may include performing more than four programming steps and more than four verification steps. Before performing the first programming step P1, memory cells may be erased and initially verified. The erased memory cells may have an initial threshold voltage distribution level.

In FIG. 4, a drain selection line DSL may correspond to a gate electrode of a drain selection transistor DST, a selected word line Sel. WL and an unselected word lines Unsel. WL may correspond to gate electrodes of cell transistors CT, and a source selection line SSL may correspond to a gate electrode of a source selection transistor SST.

FIGS. 5A to 5H illustrate voltage applying conditions during a programming operation of a three-dimensional semiconductor memory device according to an embodiment of the present disclosure.

Figure 5A:
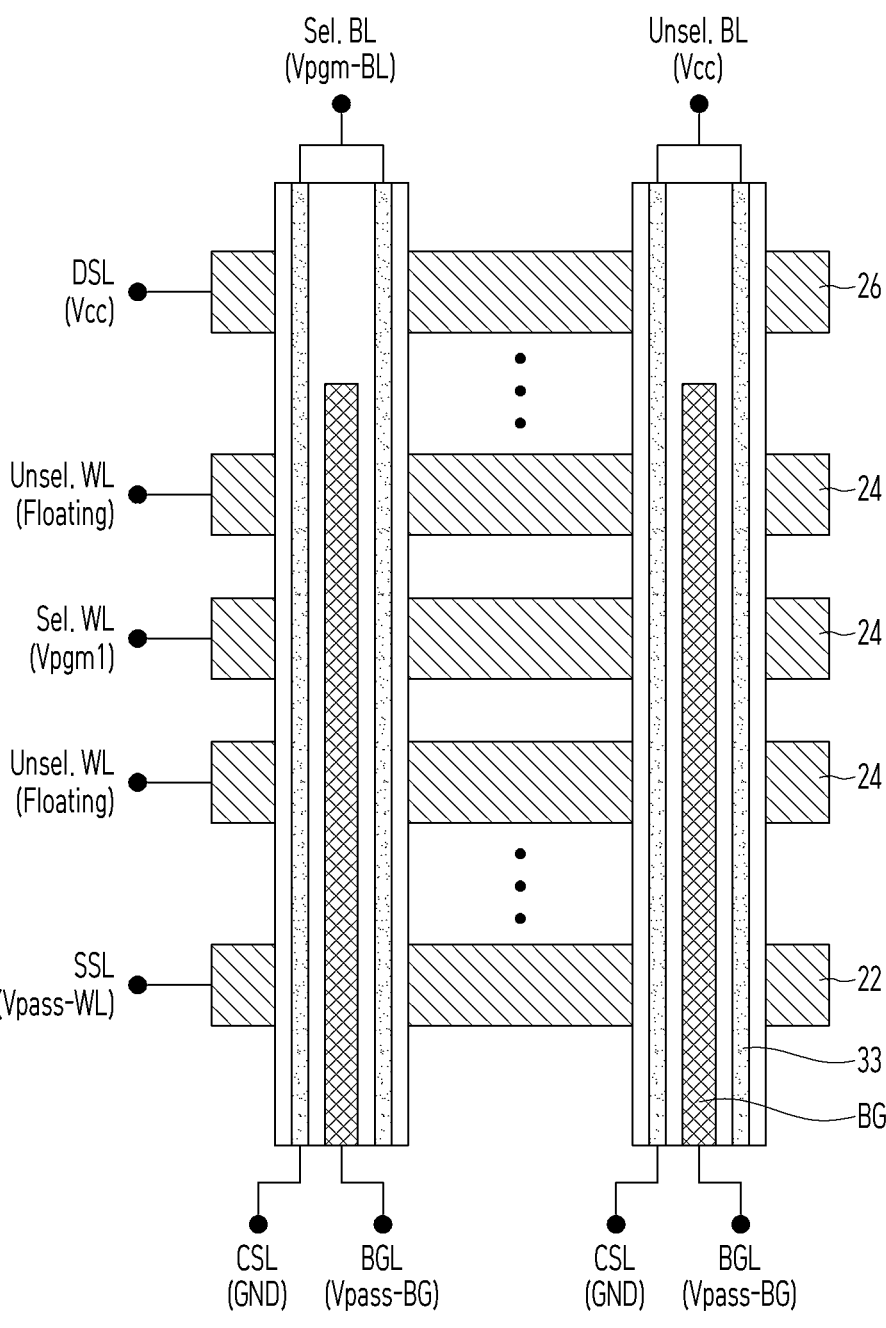
FIGS. 5A to 5H illustrate voltage applying conditions during a programming operation of a three-dimensional semiconductor memory device according to an embodiment of the present disclosure.

Referring to FIGS. 4 and 5A, the programming operation may include writing first data into first memory cells in the first programming step P1, the first memory cells being included in a memory cell array of the three-dimensional semiconductor memory device. For example, in the first programming step P1, the programming operation may include applying a bit line programming voltage Vpgm-BL to a selected bit line Sel. BL, applying a turn-on voltage Vcc to an unselected bit line Unsel. BL, applying the turn-on voltage Vcc to the drain selection line DSL, applying a first programming voltage Vpgm1 to the selected word line Sel. WL, floating the unselected word lines Unsel. WL, applying a word line pass voltage Vpass-WL to the source selection line SSL, applying a ground voltage GND to a common source line CSL, and applying a back-gate pass voltage Vpass-BG to a back-gate electrode BG through a back-gate line BGL.

The bit line programming voltage Vpgm-BL may be a negative (−) voltage. For example, the bit line programming voltage Vpgm-BL may be a selected voltage between (−)1V and (−)3V. In an embodiment, the bit line programming voltage Vpgm-BL may be (−)2V. In another embodiment, the bit line programming voltage Vpgm-BL may be lower than (−)3V.

The turn-on voltage Vcc may be used to turn on the drain selection transistor DST, the cell transistors CT, and the source selection transistor SST. The turn-on voltage Vcc may be lower than the word line pass voltage Vpass-WL and the back-gate pass voltage Vpass-BG. In an embodiment, the turn-on voltage Vcc may be a voltage selected between 1.5V and 5.5V. In an embodiment, the turn-on voltage Vcc may be about 3.3 V.

The first programming voltage Vpgm1 may be a voltage applied to the selected word line Sel. WL to write the first data into the first memory cells. A voltage difference between the first programming voltage Vpgm1 and the bit line programming voltage Vpgm-BL may be sufficiently large to induce the Fowler-Nordheim tunneling. In an embodiment, the first programming voltage Vpgm1 may be a voltage selected between 10V and 25V. The first memory cells may be programmed to have a first threshold voltage distribution level. The first threshold voltage distribution level may be greater than the initial threshold voltage distribution level. In the embodiment, because the bit line programming voltage Vpgm-BL applied to the selected bit line Sel. BL is a negative (−) voltage, the first programming voltage Vpgm1 may be lower than if the ground voltage GND (i.e., 0V) were applied to the selected bit line Sel. BL. Because the first programming voltage Vpgm1 is lowered, cell disturbance can be reduced in the programming operation, programming speed can be improved, and power consumption can be reduced.

The word line pass voltage Vpass-WL and the back-gate pass voltage Vpass-BG may be voltages between the first programming voltage Vpgm1 and the ground voltage GND. Each of the word line pass voltage Vpass-WL and the back-gate pass voltage Vpass-BG may be greater than the turn-on voltage Vcc. In an embodiment, the word line pass voltage Vpass-WL and the back-gate pass voltage Vpass-BG may be voltages selected between 5V and 10V. In an embodiment, the word line pass voltage Vpass-WL and the back-gate pass voltage Vpass-BG may be about 7V. For example, the word line pass voltage Vpass-WL may be the same as the back-gate pass voltage Vpass-BG.

Figure 5B:
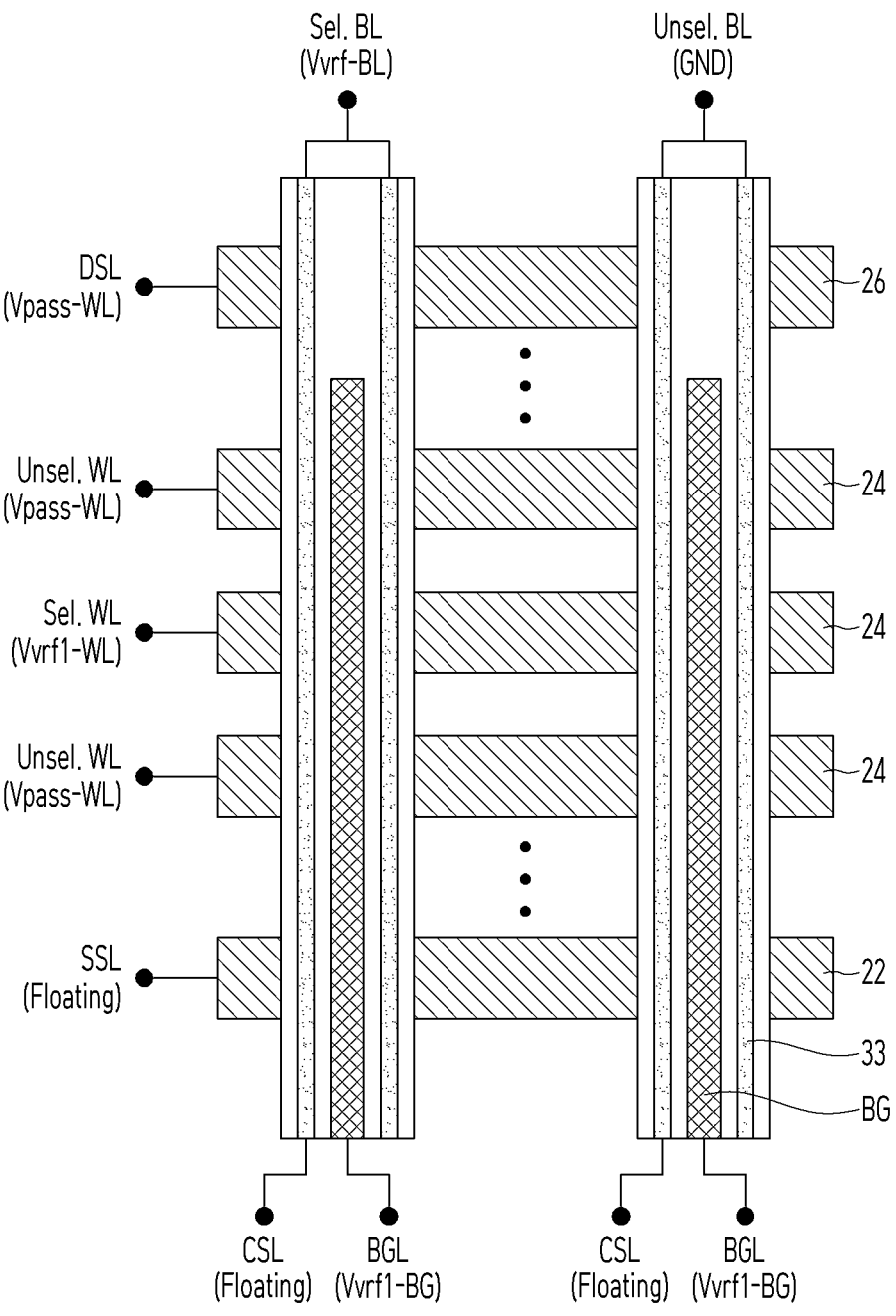

Referring to FIGS. 4 and 5B, the programming operation may include verifying the first data stored in the first memory cells in the first verification step V1. In the first verification step V1, the programming operation may include applying a bit line verification voltage Vvrf-BL to the selected bit line Sel. BL, applying the ground voltage GND to the unselected bit line Unsel. BL, applying the word line pass voltage Vpass-WL to the drain selection line DSL, applying a first word line verification voltage Vvrf1-WL to the selected word line Sel. WL, applying the word line pass voltage Vpass-WL to the unselected word line Unsel. WL, floating the source selection line SSL and/or the common source line CSL, and applying a first back-gate verification voltage Vvrf1-BG to the back-gate electrode BG.

The bit line verification voltage Vvrf-BL may be a positive (+) voltage. In an embodiment, the bit line verification voltage Vvrf-BL may be a voltage selected between (+)0.3V and (+)3.3V. In an embodiment, the bit line verification voltage Vvrf-BL may be (+)1V. The bit line verification voltage Vvrf-BL may be lower than the word line pass voltage Vpass-WL and/or the back-gate pass voltage Vpass-BG. The bit line verification voltage Vvrf-BL may be lower than the turn-on voltage Vcc.

The first word line verification voltage Vvrf1-WL may be used to verify the first threshold voltage distribution level of the first memory cells. The first word line verification voltage Vvrf1-WL may be a negative (−) voltage. In another embodiment, the first word line verification voltage Vvrf1-WL may be a zero voltage. In still another embodiment, the first word line verification voltage Vvrf1-WL may be a positive (+) voltage.

The first back-gate verification voltage Vvrf1-BG may prevent disturbance of unselected memory cells. For example, the first back-gate verification voltage Vvrf1-BG may be a positive (+) voltage. In another embodiment, the first back-gate verification voltage Vvrf1-BG may be a zero voltage. In still another embodiment, the first back-gate verification voltage Vvrf1-BG may be a negative (−) voltage.

Figure 5C:
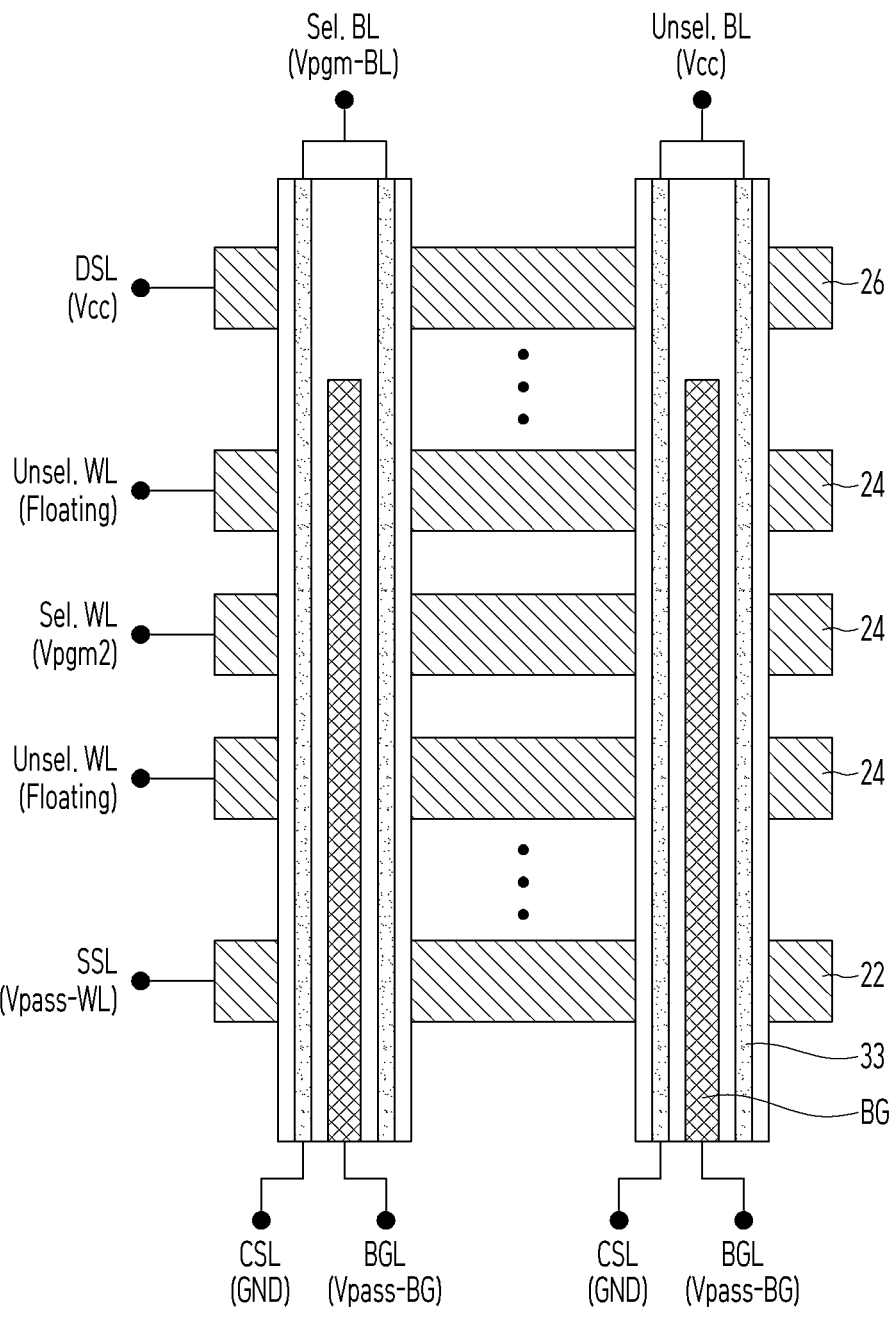

Referring to FIGS. 4 and 5C, the programming operation may include writing second data into second memory cells in the second programming step P2. In an embodiment, the second memory cells may be selected from the first memory cells. In another embodiment, the second memory cells may be selected from memory cells other than the first memory cells in the memory cell array.

In the second programming step P2, the programming operation may include applying the bit line programming voltage Vpgm-BL to the selected bit line Sel. BL, applying the turn-on voltage Vcc to the unselected bit line Unsel. BL, applying the turn-on voltage Vcc to the drain selection line DSL, applying a second programming voltage Vpgm2 to the selected word line Sel. WL, floating the unselected word line Unsel. WL, applying the word line pass voltage Vpass-WL to the source selection line SSL, applying the ground voltage GND to the common source line CSL, and applying the back-gate pass voltage Vpass-BG to the back-gate electrode BG. The second programming voltage Vpgm2 may be greater than the first programming voltage Vpgm1. Accordingly, the second memory cells may include more electrons than the first memory cells. For example, the second memory cells may be programmed to have a second threshold voltage distribution level that is greater than the first threshold voltage distribution level of the first memory cells.

Figure 5D:
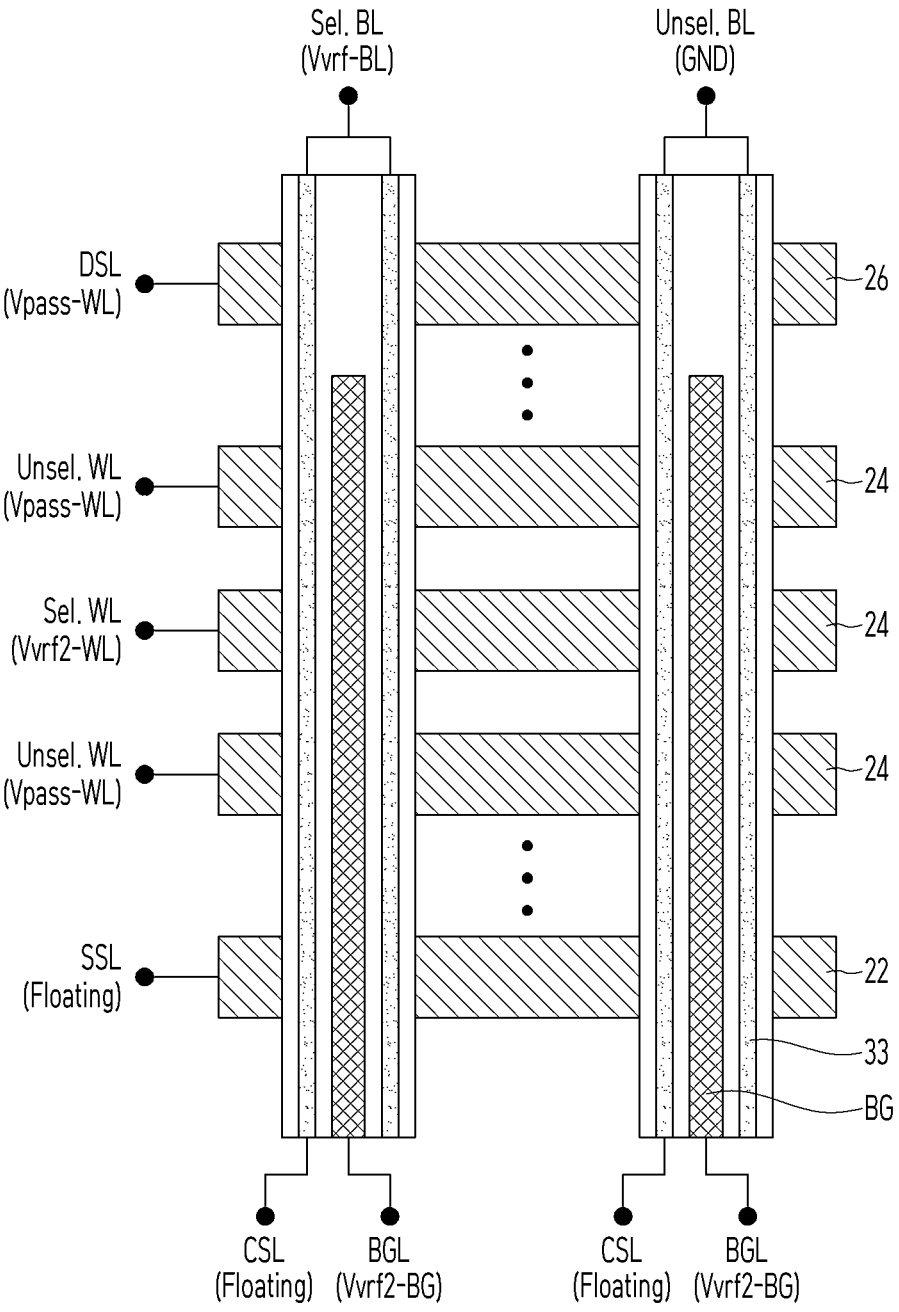

Referring to FIGS. 4 and 5D, the programming operation may include verifying the second data stored in the second memory cells in the second verification step V2. In the second verification step V2, the programming operation may include applying the bit line verification voltage Vvrf-BL to the selected bit line Sel. BL, applying the ground voltage GND to the unselected bit line Unsel. BL, applying the word line pass voltage Vpass-WL to the drain selection line DSL, applying a second word line verification voltage Vvrf2-WL to the selected word line Sel. WL, applying the word line pass voltage Vpass-WL to the unselected word line Unsel. WL, floating the source selection line SSL and/or the common source line CSL, and applying a second back-gate verification voltage Vvrf2-BG to the back-gate electrode BG.

The second word line verification voltage Vvrf2-WL may verify the second threshold voltage distribution level of the second memory cells. The second word line verification voltage Vvrf2-WL may be greater than the first word line verification voltage Vvrf1-WL. The second word line verification voltage Vvrf2-WL may be a negative (−) voltage. In another embodiment, the second word line verification voltage Vvrf2-WL may be a zero voltage. In still another embodiment, the second word line verification voltage Vvrf2-WL may be a positive (+) voltage.

The second back-gate verification voltage Vvrf2-BG may be lower than the first back-gate verification voltage Vvrf1-BG. The second back-gate verification voltage Vvrf2-BG may be a positive (+) voltage. In another embodiment, the second back-gate verification voltage Vvrf2-BG may be a zero voltage. In still another embodiment, the second back-gate verification voltage Vvrf2-BG may be a negative (−) voltage.

A voltage difference between the second word line verification voltage Vvrf2-WL and the second back-gate verification voltage Vvrf2-BG may be greater than a voltage difference between the first word line verification voltage Vvrf1-WL and the first back-gate verification voltage Vvrf1-BG.

Figure 5E:
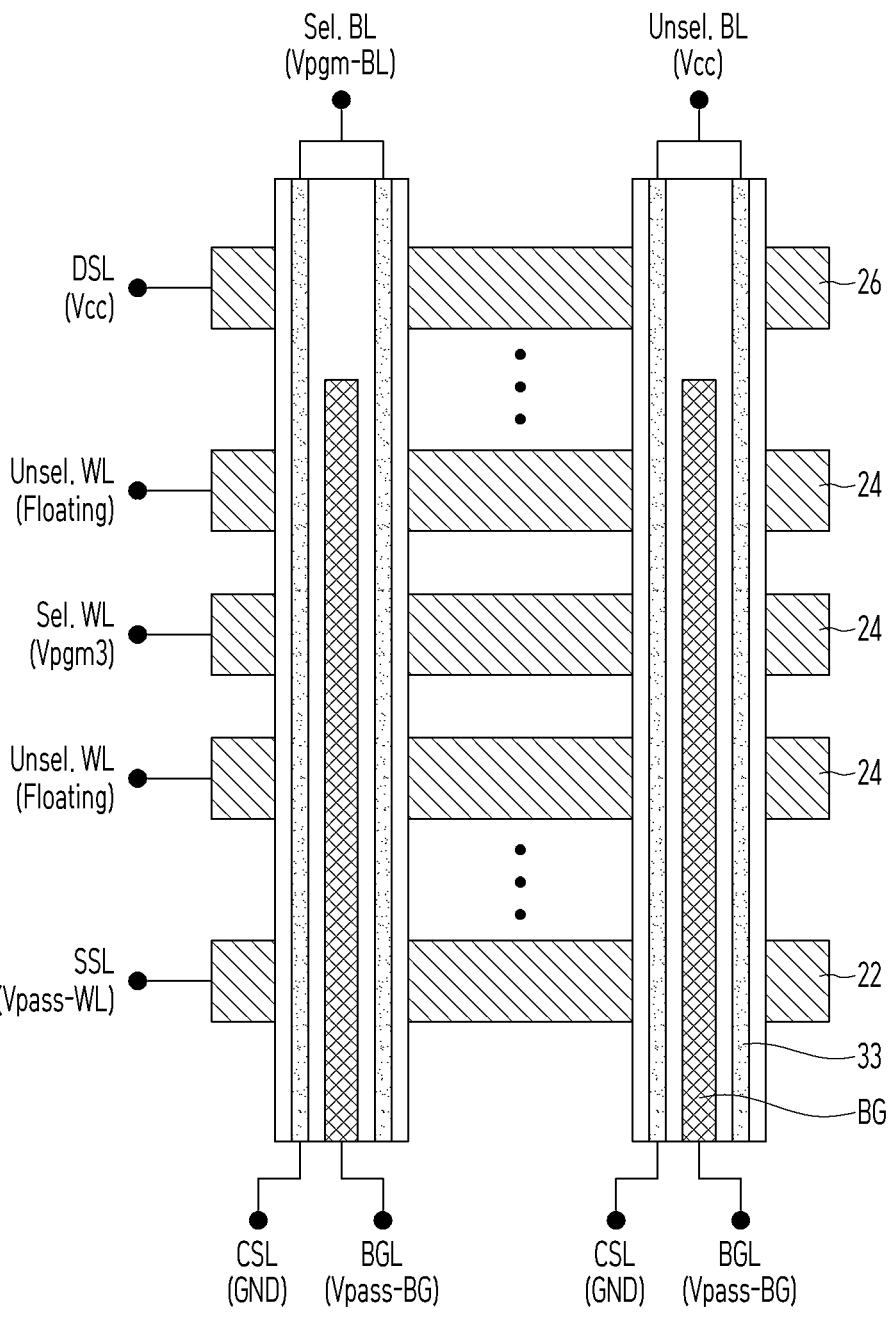

Referring to FIGS. 4 and 5E, the programming operation may include writing third data into third memory cells in the third programming step P3. In an embodiment, the third memory cells may be selected from the second memory cells. In another embodiment, the third memory cells may be selected from memory cells other than the first and second memory cells in the memory cell array. In the third programming step P3, the programming operation may include applying the bit line programming voltage Vpgm-BL to the selected bit line Sel. BL, applying the turn-on voltage Vcc to the unselected bit line Unsel. BL, applying the turn-on voltage Vcc to the drain selection line DSL, applying a third programming voltage Vpgm3 to the selected word line Sel. WL, floating the unselected word line Unsel. WL, applying the word line pass voltage Vpass-WL to the source selection line SSL, applying the ground voltage GND to the common source line CSL, and applying the back-gate pass voltage Vpass-BG to the back-gate electrode BG. The third programming voltage Vpgm3 may be greater than the second programming voltage Vpgm2. Accordingly, the third memory cells may include more electrons than the second memory cells. For example, the third memory cells may be programmed to have a third threshold voltage distribution level that is greater than the second threshold voltage distribution level of the second memory cells.

Figure 5F:
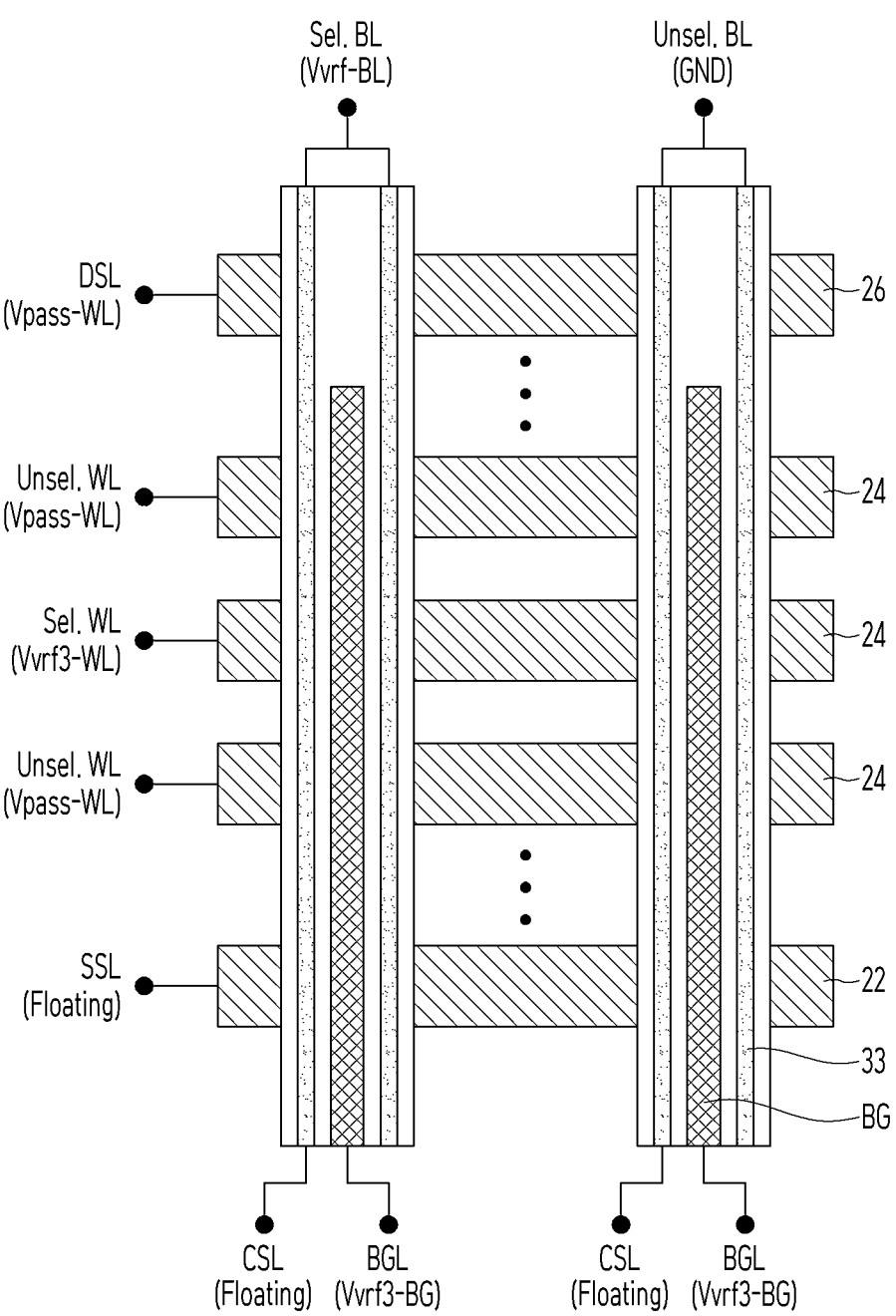

Referring to FIGS. 4 and 5F, the programming operation may include verifying the third data stored in the third memory cells in the third verification step V3. In the third programming step P3, the programming operation may include applying the bit line verification voltage Vvrf-BL to the selected bit line Sel. BL, applying the ground voltage GND to the unselected bit line Unsel. BL, applying the word line pass voltage Vpass-WL to the drain selection line DSL, applying a third word line verification voltage Vvrf3-WL to the selected word line Sel. WL, applying the word line pass voltage Vpass-WL to the unselected word line Unsel. WL, floating the source selection line SSL and/or the common source line CSL, and applying a third back-gate verification voltage Vvrf3-BG to the back-gate electrode BG.

The third word line verification voltage Vvrf3-WL may be greater than the second word line verification voltage Vvrf2-WL. The third back-gate verification voltage Vvrf3-BG may be lower than the second back-gate verification voltage Vvrf2-BG. A voltage difference between the third word line verification voltage Vvrf3-WL and the third back-gate verification voltage Vvrf3-BG may be greater than the voltage difference between the second word line verification voltage Vvrf2-WL and the second back-gate verification voltage Vvrf2-BG.

Figure 5G:
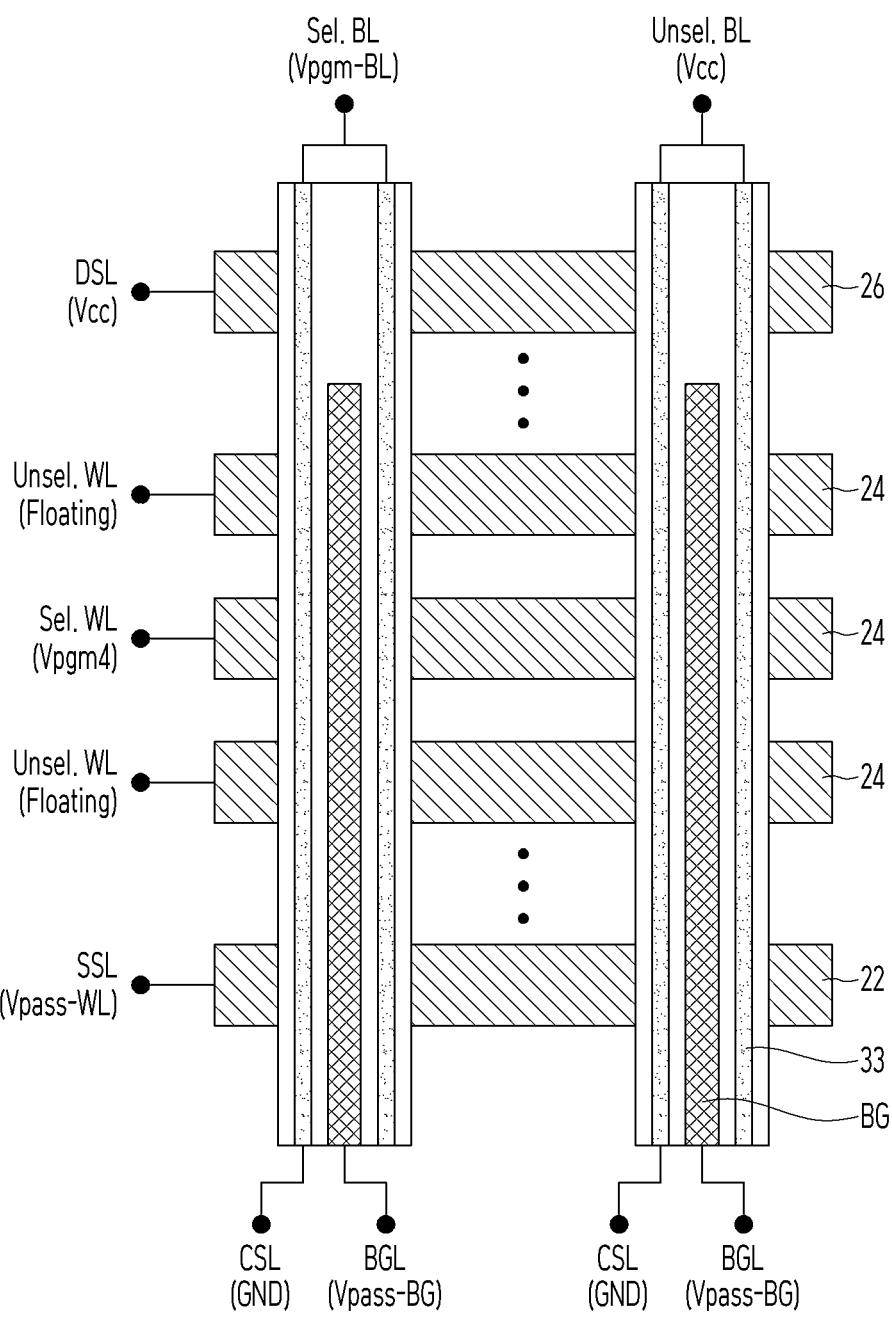

Referring to FIGS. 4 and 5G, the programming operation may include writing fourth data into fourth memory cells in the fourth programming step P4. The fourth memory cells may be selected from the third memory cells. In another embodiment, the fourth memory cells may be selected from memory cells other than the first to third memory cells in the memory cell array. In the fourth programming step P4, the programming operation may include applying the bit line programming voltage Vpgm-BL to the selected bit line Sel. BL, applying the turn-on voltage Vcc to the unselected bit line Unsel. BL, applying the turn-on voltage Vcc to the drain selection line DSL, applying a fourth programming voltage Vpgm4 to the selected word line Sel. WL, floating the unselected word line Unsel. WL, applying the word line pass voltage Vpass-WL to the source selection line SSL, applying the ground voltage GND to the common source line CSL, and applying the back-gate pass voltage Vpass-BG to the back-gate electrode BG. The fourth programming voltage Vpgm4 may be greater than the third programming voltage Vpgm3. Accordingly, the fourth memory cells may include more electrons than the third memory cells. For example, the fourth memory cells may be programmed to have a fourth threshold voltage distribution level that is greater than the third threshold voltage distribution level of the third memory cells.

Figure 5H:
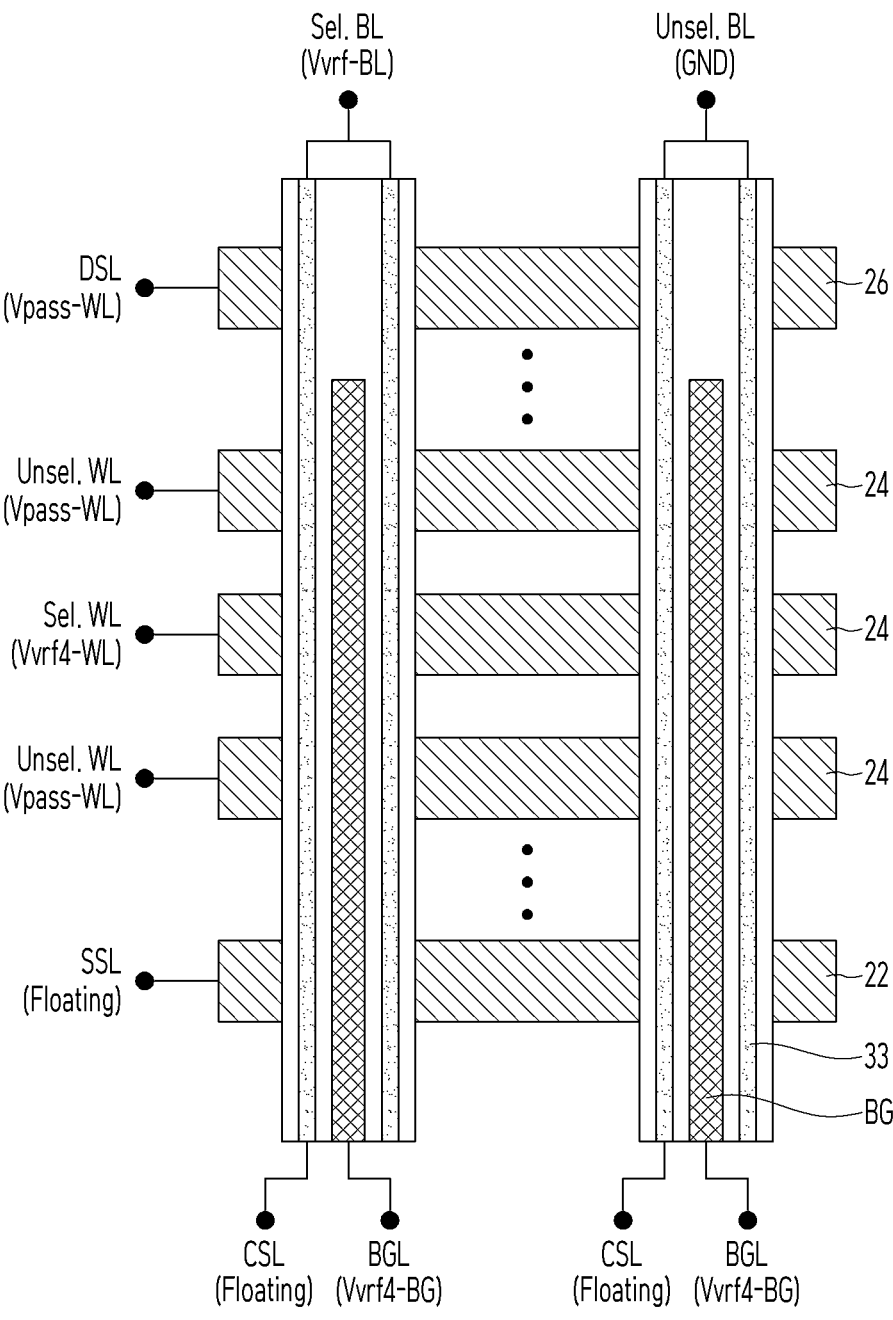

Referring to FIGS. 4 and 5H, the programming operation may include verifying the fourth data stored in the fourth memory cells in the fourth verification step V4. In the fourth verification step V4, the programming operation may include applying the bit line verification voltage Vvrf-BL to the selected bit line Sel. BL, applying the ground voltage GND to the unselected bit line Unsel. BL, applying the word line pass voltage Vpass-WL to the drain selection line DSL, applying a fourth word line verification voltage Vvrf4-WL to the selected word line Sel. WL, applying the word line pass voltage Vpass-WL to the unselected word line Unsel. WL, floating the source selection line SSL and/or the common source line CSL, and applying a fourth back-gate verification voltage Vvrf4-BG to the back-gate electrode BG.

The fourth word line verification voltage Vvrf4-WL may be greater than the third word line verification voltage Vvrf3-WL. The fourth back-gate verification voltage Vvrf4-BG may be lower than the third back-gate verification voltage Vvrf3-BG. A voltage difference between the fourth word line verification voltage Vvrf4-WL and the fourth back-gate verification voltage Vvrf4-BG may be greater than the voltage difference between the third word line verification voltage Vvrf3-WL and the third back-gate verification voltage Vvrf3-BG.

In another embodiment, the programming operation may further include alternately repeating additional programming steps and/or additional verification steps.

As illustrated in FIG. 4 and described above with reference to FIGS. 5A to 5H, in the programming steps P1 to P4, the programming voltages Vpgm1 to Vpgm4 applied to the selected word line Sel. WL may gradually increase. In the verification steps V1 to V4, the word line verification voltages Vvrf1-WL to Vvrf4-WL applied to the selected word line Sel. WL may also gradually increase. In the verification steps V1 to V4, the back-gate verification voltages Vvrf1-BG to Vvrf4-BG applied to the back-gate electrode BG may gradually decrease.

Figure 6A:
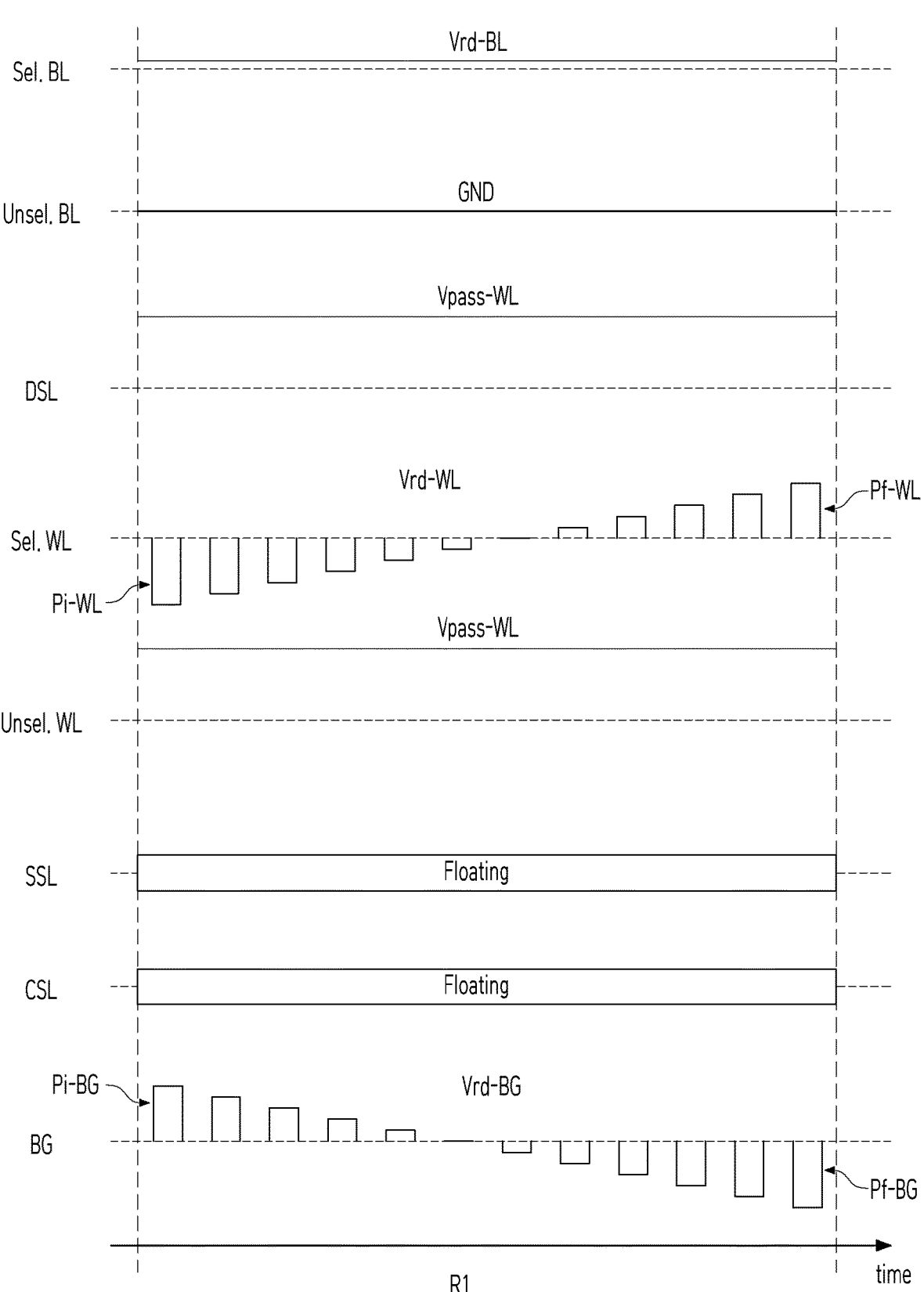
FIG. 6A is a timing diagram illustrating a read operation of a three-dimensional semiconductor memory device according to an embodiment of the present disclosure.
Figure 6B:
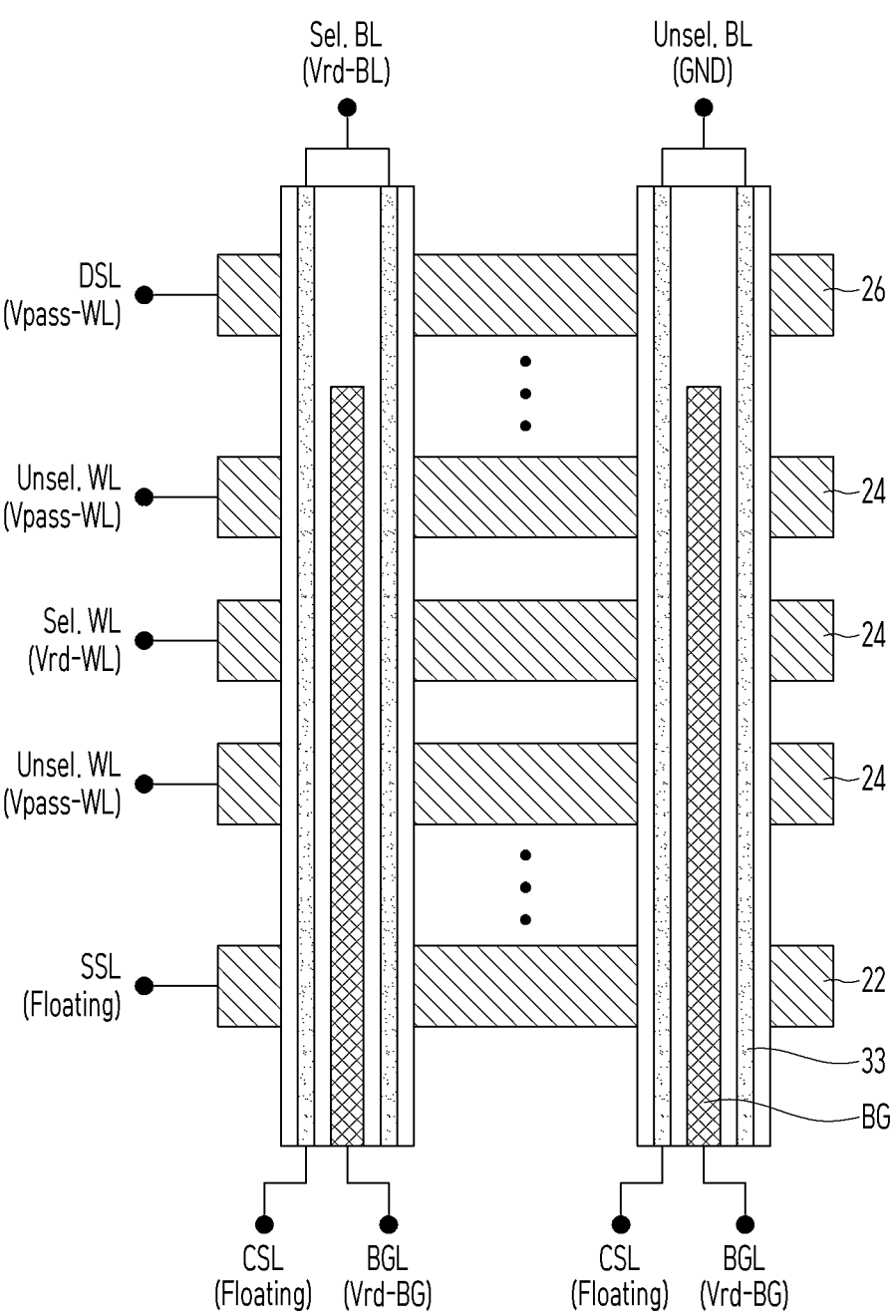
FIG. 6B is a longitudinal cross-sectional view illustrating a voltage application condition during the read operation of the three-dimensional semiconductor device according to the embodiment of the present disclosure.

FIG. 6A is a timing diagram illustrating a read operation of a three-dimensional semiconductor memory device according to an embodiment of the present disclosure. FIG. 6B is a longitudinal cross-sectional view illustrating a voltage application condition during the read operation of the three-dimensional semiconductor device according to the embodiment of the present disclosure.

Referring to FIGS. 6A and 6B, in a reading step R1, the reading operation may include applying a bit line read voltage Vrd-BL to a selected bit line Sel. BL, applying the ground voltage GND to an unselected bit line Unsel. BL, applying the word line pass voltage Vpass-WL to the drain selection line DSL, applying a word line read voltage Vrd-WL to a selected word line Sel. WL, applying the word line pass voltage Vpass-WL to an unselected word line Unsel. WL, floating the source selection line SSL and/or the common source line CSL, and applying a back-gate read voltage Vrd-BG to the back-gate electrode BG.

The word line read voltage Vrd-WL may include a plurality of pulses that change from a negative (−) voltage to a positive (+) voltage. For example, the word line read voltage Vrd-WL may include a plurality of pulses with voltage levels that gradually increase from the initial pulse Pi-WL at (−)3V to the final pulse Pf-WL at (+)3V.

The back-gate read voltage Vrd-BG may include a plurality of pulses that change from a positive (+) voltage to a negative (−) voltage. For example, the back-gate read voltage Vrd-BG may include a plurality of pulses with voltage levels that gradually decrease from the initial pulse Pi-BG at (+)3V to the final pulse Pf-BG at (−)3V.

The word line read voltage Vrd-WL and the back-gate read voltage Vrd-BG may not have the same voltage at the same time. In another embodiment, the word line read voltage Vrd-WL and the back-gate read voltage Vrd-BG may have the same voltage at the same time.

Figure 7:
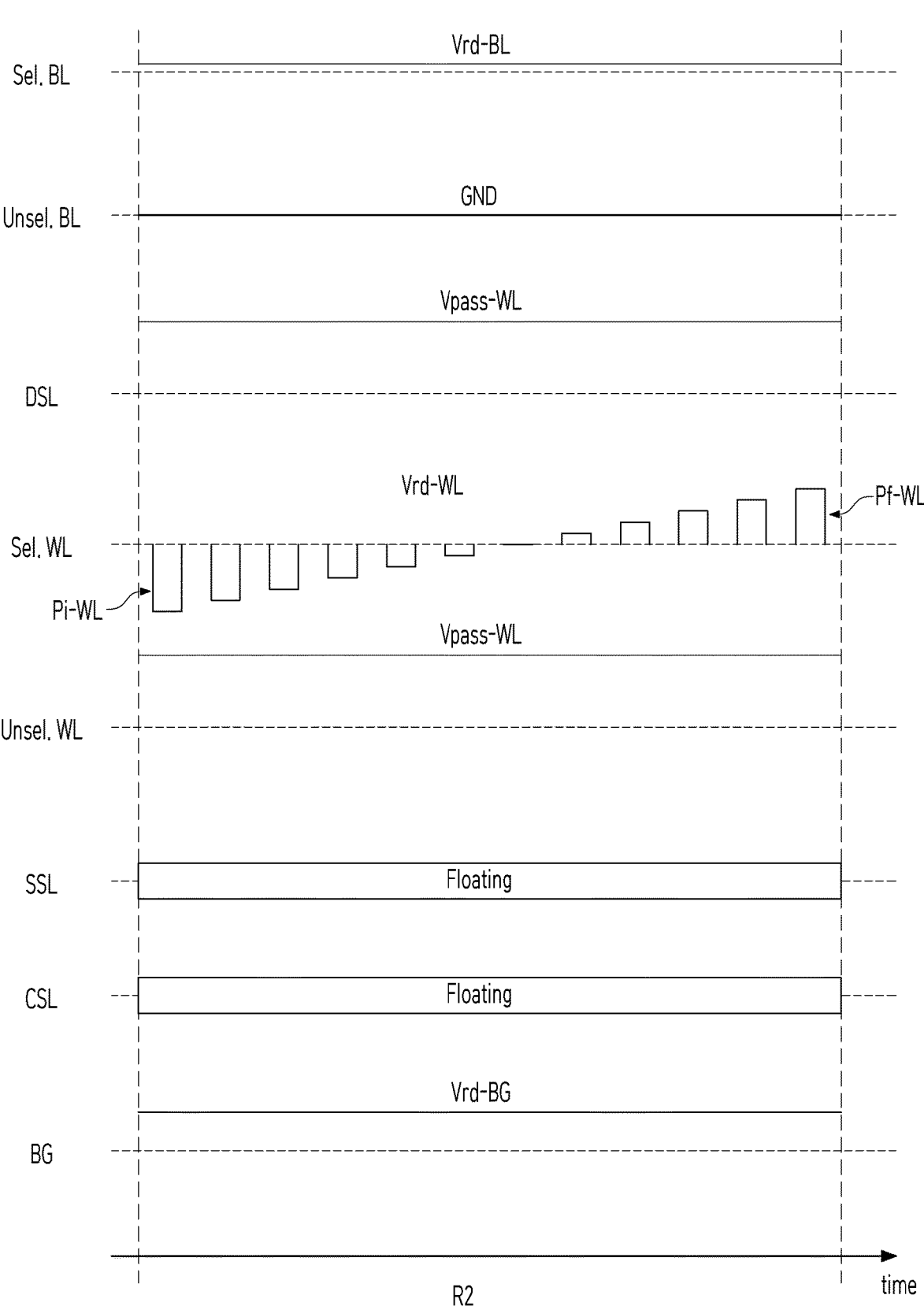
FIG. 7 is a timing diagram illustrating a read operation of a three-dimensional semiconductor memory device according to an embodiment of the present disclosure.

FIG. 7 is a timing diagram illustrating a read operation of a three-dimensional semiconductor memory device according to an embodiment of the present disclosure. Referring to FIG. 7, in a reading step R2, the reading operation may include applying the bit line read voltage Vrd-BL to the selected bit line Sel. BL, applying the ground voltage GND to the unselected bit line Unsel. BL, applying the word line pass voltage Vpass-WL to the drain selection line DSL, applying the word line read voltage Vrd-WL to the selected word line Sel. WL, applying the word line pass voltage Vpass-WL to the unselected word line Unsel. WL, floating the source selection line SSL and the common source line CSL, and applying the back-gate read voltage Vrd-BG to the back-gate electrode BG.

The word line read voltage Vrd-WL may include a plurality of pulses that change from a negative (−) voltage to a positive (+) voltage. The back-gate read voltage Vrd-BG may be a positive (+) voltage. The back-gate read voltage Vrd-BG may prevent disturbance of unselected memory cells adjacent to the selected memory cell in the read step R2.

Figure 8A:
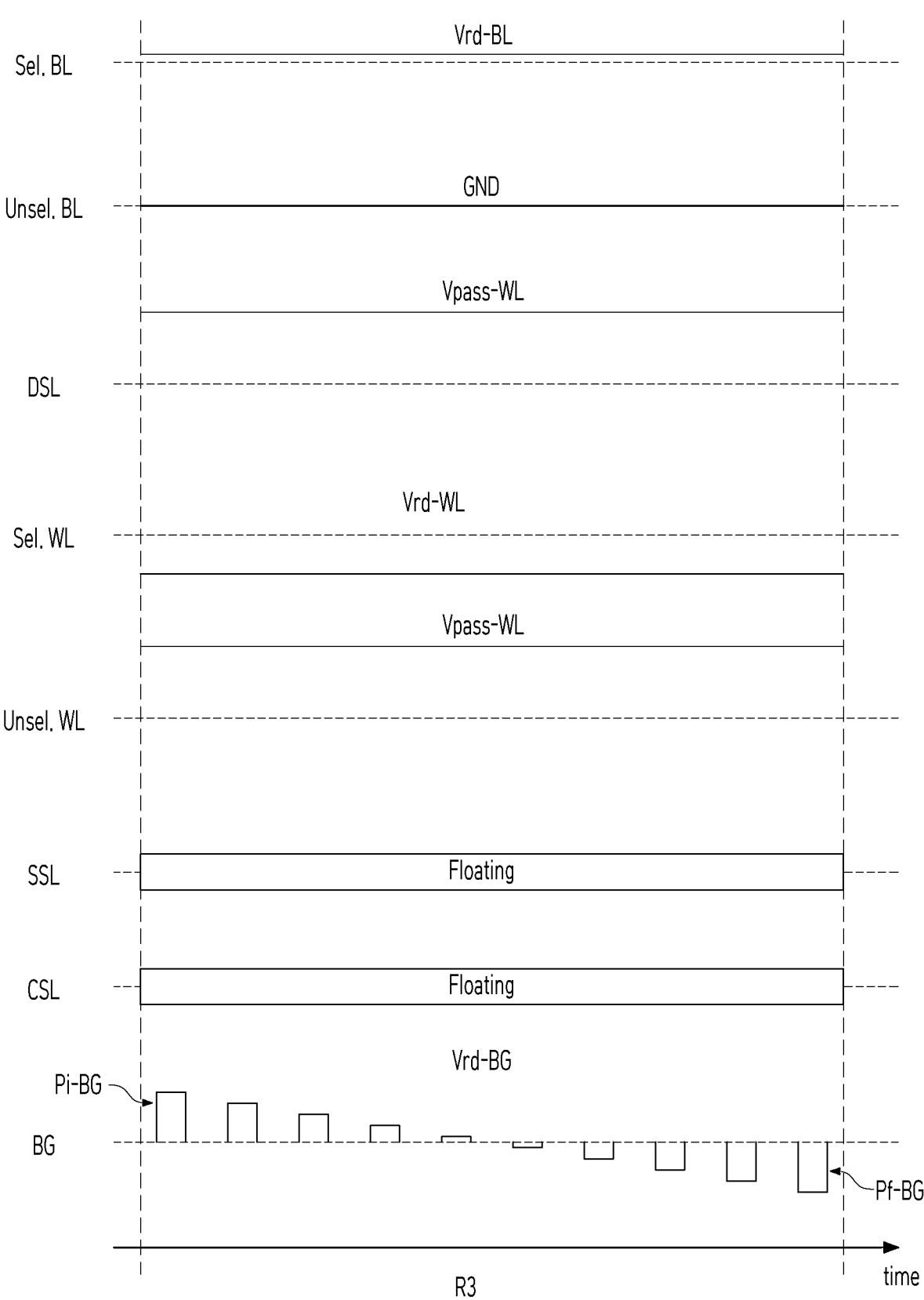
FIGS. 8A and 8B are timing diagrams illustrating reading operations of a three-dimensional semiconductor memory device according to embodiments of the present disclosure.
Figure 8B:
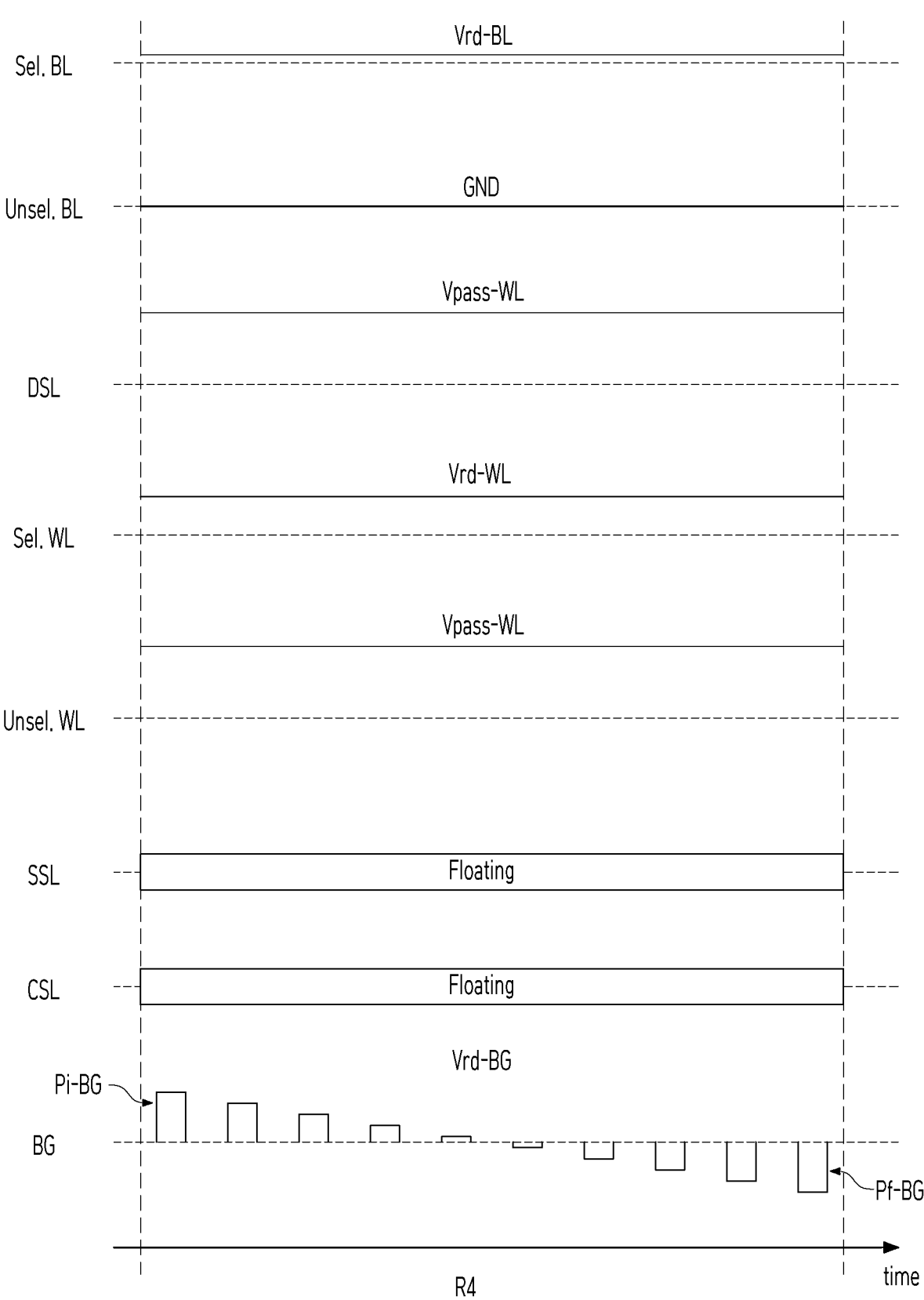

FIGS. 8A and 8B are timing diagrams illustrating reading operations of a three-dimensional semiconductor memory device according to embodiments of the present disclosure. Referring to FIGS. 8A and 8B, in reading steps R3 and R4, each of the reading operations may include applying the bit line read voltage Vrd-BL to the selected bit line Sel. BL, applying the ground voltage GND to the unselected bit line Unsel. BL, applying the word line pass voltage Vpass-WL to the drain selection line DSL, applying the word line read voltage Vrd-WL to the selected word line Sel. WL, applying the word line pass voltage Vpass-WL to the unselected word line Unsel. WL, floating the source selection line SSL and/or the common source line CSL, and applying the back-gate read voltage Vrd-BG to the back-gate electrode BG.

Referring to FIG. 8A, the word line read voltage Vrd-WL may be a negative (−) voltage. The back-gate read voltage Vrd-BG may include a plurality of pulses that gradually decrease from a positive (+) voltage to a negative (−) voltage. For example, the back-gate read voltage Vrd-BG may include a plurality of pulses with voltage levels that gradually decrease from the initial pulse Pi-BG at (+)3V to the final pulse Pf-BG at (−)3V. The word line read voltage Vrd-WL and the back-gate read voltage Vrd-BG may not have the same voltage at the same time. In another embodiment, the word line read voltage Vrd-WL and the back-gate read voltage Vrd-BG may have the same voltage at the same time.

Referring to FIG. 8B, the word line read voltage Vrd-WL may be a positive (+) voltage. The back-gate read voltage Vrd-BG may include a plurality of pulses that gradually decrease from a positive (+) voltage to a negative (−) voltage. For example, the back-gate read voltage Vrd-BG may include a plurality of pulses with voltage levels that gradually decrease from the initial pulse Pi-BG at (+)3V to the final pulse Pf-BG at (−)3V. The word line read voltage Vrd-WL and the back-gate read voltage Vrd-BG may not have the same voltage at the same time.

According to the embodiments of the present disclosure, during the programming operation, a voltage difference between the selected word line and the selected bit line is reduced by applying the back-gate pass voltage to the back-gate electrode, so that the operation speed can be improved.

According to the embodiments of the present disclosure, the threshold voltage distribution levels of data written in the memory layer can be accurately verified using various back-gate verification voltages during the verifying operation. Accordingly, the threshold voltage distribution levels can be quickly and accurately determined in the verifying operation. That is, a memory window can be expanded.

According to the embodiments of the present disclosure, the threshold voltage distribution levels of data stored in the memory layer can be read using the various back-gate reading voltages during the reading operation. Accordingly, the threshold voltage distribution levels of data stored in the memory layer can be quickly and accurately read in the reading operation. That is, the memory window can be expanded.

According to the embodiments of the present disclosure, the threshold voltage distribution levels of data stored in the memory layer can be read using the positive (+) gate reading voltages during the reading operation. Accordingly, the data disturbance of unselected memory cells can be prevented during the reading operation. As a result, a vertical height or a vertical thickness of the memory cell in the three-dimensional memory device can be reduced.

According to the embodiments of the present disclosure, interference of memory cells of the three-dimensional semiconductor memory device in the vertical direction can be reduced. Accordingly, the number of stacked memory cells of a cell string can be increased, and a degree of integration of the three-dimensional semiconductor memory device can be improved.

While the present invention has been described with respect to the specific embodiments, it will be apparent to those skilled in the art that various changes and modifications may be made without departing from the spirit and scope of the invention as defined in the following claims.

What is claimed is:

1. A method of programming a three-dimensional semiconductor memory device, wherein the three-dimensional semiconductor memory device comprises:

word lines extending in a first direction and stacked in a third direction, the first direction being parallel to a top surface of a substrate, the third direction being perpendicular to the top surface of the substrate;

vertical channel structures that pass through the word lines, wherein each of the vertical channel structures includes a back-gate electrode, a channel layer, and a memory layer;

a common source line electrically connected to a first end of the channel layer of each of the vertical channel structures;

bit lines extending in a second direction, each of the bit lines being electrically connected to a second end of the channel layer of each of the vertical channel structures, the second direction crossing the first direction and parallel to the top surface of the substrate; and a back-gate line electrically connected to a first end of the back-gate electrode of each of the vertical channel structures, wherein the method comprises:

applying a first word line programming voltage to a selected word line among the word lines, floating unselected word lines among the word lines, and applying a back-gate pass voltage to the back-gate electrode in a first programming step;

applying a first word line verification voltage to the selected word line, applying a word line pass voltage to the unselected word lines, and applying a first back-gate verification voltage to the back-gate electrode in a first verification step;

applying a second word line programming voltage to the selected word line, floating the unselected word lines, and applying the back-gate pass voltage to the back-gate electrode in a second programming step; and applying a second word line verification voltage to the selected word line, applying the word line pass voltage to the unselected word lines, and applying a second back-gate verification voltage to the back-gate electrode in a second verification step, wherein the second word line programming voltage is greater than the first word line programming voltage, and the second back-gate verification voltage is lower than the first back-gate verification voltage.

2. The method of claim 1, further comprising:

applying a third word line programming voltage to the selected word line, floating the unselected word lines, and applying the back-gate pass voltage to the back-gate electrode in a third programming step; and applying a third word line verification voltage to the selected word line, applying the word line pass voltage to the unselected word lines, and applying a third back-gate verification voltage to the back-gate electrode in a third verification step, wherein the third word line programming voltage is greater than the second word line programming voltage, and the third back-gate verification voltage is lower than the second back-gate verification voltage.

3. The method of claim 2, further comprising:

applying a fourth word line programming voltage to the selected word line, floating the unselected word lines, and applying the back-gate pass voltage to the back-gate electrode in a fourth programming step; and applying a fourth word line verification voltage to the selected word line, applying the word line pass voltage to the unselected word lines, and applying a fourth back-gate verification voltage to the back-gate electrode in a fourth verification step, wherein the fourth word line programming voltage is greater than the third word line programming voltage, and the fourth back-gate verification voltage is lower than the third back-gate verification voltage.

4. The method of claim 1, further comprising, in each of the first programming step and the second programming step:

applying a bit line programming voltage to a selected bit line among the bit lines, and applying a turn-on voltage to unselected bit lines among the bit lines, wherein the bit line programming voltage is a negative voltage, and the turn-on voltage is lower than the word line pass voltage.

5. The method of claim 1,
wherein the word lines include:
a drain selection line disposed closest to the bit line; and
a source selection line disposed closest to the common
    source line,
wherein the method further comprises, in each of the first
    programming step and the second programming step:
applying a turn-on voltage to the drain selection line;
applying the word line pass voltage to the source selection
    line; and
applying a ground voltage to the common source line.

6. The method of claim 1, further comprising, in each of
the first verification step and the second verification step:
applying a bit line verification voltage to a selected bit line
    among the bit lines; and
applying a ground voltage to unselected bit lines among
    the bit lines,
wherein the bit line verification voltage is a positive
    voltage lower than the word line pass voltage.

7. The method of claim 1,
wherein the word lines include:
a drain selection line disposed closest to the bit line; and
a source selection line disposed closest to the common
    source line,
wherein the method further comprises, in each of the first
    verification step and the second verification step:
applying the word line pass voltage to the drain selection
    line; and
floating the source selection line and the common source
    line.

8. A method of reading a three-dimensional semiconduc-
tor memory device,
wherein the three-dimensional semiconductor memory
    device comprises:
word lines extending in a first direction and stacked in a
    third direction, the first direction being parallel to a top
    surface of a substrate, the third direction being perpen-
    dicular to the top surface of the substrate;
vertical channel structures that pass through the word
    lines, wherein each of the vertical channel structures
    includes a back-gate electrode, a channel layer, and a
    memory layer;
a common source line electrically connected to a first end
    of the channel layer of each of the vertical channel
    structures;
bit lines extending in a second direction, each of the bit
    lines being electrically connected to a second end of the
    channel layer of each of the vertical channel structures,
    the second direction crossing the first direction and
    parallel to the top surface of the substrate; and
a back-gate line electrically connected to a first end of the
    back-gate electrode of each of the vertical channel
    structures,
wherein the method comprises:
applying a word line read voltage to a selected word line
    among the word lines;
applying a word line pass voltage to unselected word lines
    among the word lines; and
applying a back-gate read voltage to the back-gate elec-
    trode of each of the vertical channel structures,
wherein the word line read voltage includes a plurality of
    pulses that change from an initial word line read
    voltage of a negative voltage to a final word line read
    voltage of a positive voltage, and
the final word line read voltage is lower than the word line
    pass voltage.

9. The method of claim 8, wherein the back-gate read
voltage includes a plurality of pulses that change from an
initial back-gate read voltage of a positive voltage to a final
back-gate read voltage of a negative voltage.

10. The method of claim 9, wherein the word line read
voltage and the back-gate read voltage are different from
each other at a same time.

11. The method of claim 8, wherein the back-gate read
voltage has a positive voltage lower than the word line pass
voltage.

12. The method of claim 8, further comprising:
applying a bit line read voltage to a selected bit line
    among the bit lines; and
applying a ground voltage to unselected bit lines among
    the bit lines,
wherein the bit line read voltage is a positive voltage
    lower than the word line pass voltage.

13. The method of claim 8,
wherein the word lines include:
a drain selection line disposed closest to the bit line; and
a source selection line disposed closest to the common
    source line,
wherein the method further comprises:
applying the word line pass voltage to the drain selection
    line; and
floating the source selection line and the common source
    line.

14. A method of reading a three-dimensional semicon-
ductor memory device,
wherein the three-dimensional semiconductor device
    comprises:
a plurality of word lines extending in a first direction and
    stacked in a third direction, the first direction being
    parallel to a top surface of a substrate, the third direc-
    tion being perpendicular to the top surface of the
    substrate;
vertical channel structures that pass through the plurality
    of word lines, wherein each of the vertical channel
    structures includes a back-gate electrode, a channel
    layer, and a memory layer;
a common source line electrically connected to a first end
    of the channel layer of each of the vertical channel
    structures;
bit lines extending in a second direction, each of the bit
    lines being electrically connected to a second end of the
    channel layer of each of the vertical channel structures,
    the second direction crossing the first direction and
    parallel to the top surface of the substrate; and
a back-gate line electrically connected to a first end of the
    back-gate electrode of each of the vertical channel
    structures,
wherein the method comprises:
applying a word line read voltage to a selected word line
    among the plurality of word lines;
applying a word line pass voltage to unselected word lines
    among the plurality of word lines, and
applying a back-gate read voltage to the back-gate elec-
    trode,
wherein the back-gate read voltage includes a plurality of
    pulses that change from an initial back-gate read volt-
    age of a positive voltage to a final back-gate read
    voltage of a negative voltage; and
wherein the initial back-gate read voltage is lower than
    the word line pass voltage.

15. The method of claim 14, wherein the word line read
voltage includes a plurality of pulses that change from an initial word line read voltage of a negative voltage to a final word line read voltage of a positive voltage.

16. The method of claim 15, wherein the word line read voltage and the back-gate read voltage are different from each other at a same time.

17. The method of claim 14, further comprising:

applying a bit line read voltage to a selected bit line among the bit lines; and applying a ground voltage to unselected bit lines among the bit lines, wherein the bit line read voltage is a positive voltage lower than the word line pass voltage.

18. The method of claim 14, wherein each of the plurality of word lines includes:

a drain selection line disposed closest to the bit lines; and a source selection line disposed closest to the common source line, wherein the method further comprises:

applying the word line pass voltage to the drain selection line; and floating the source selection line and the common source line.

\* \* \* \* \*